(12) United States Patent
Whiting et al.

(10) Patent No.: US 10,026,579 B2
(45) Date of Patent: Jul. 17, 2018

(54) SELF-LIMITING ELECTRICAL TRIGGERING FOR INITIATING FRACTURE OF FRANGIBLE GLASS

(71) Applicant: Palo Alto Research Center Incorporated, Palo Alto, CA (US)

(72) Inventors: Gregory Whiting, Menlo Park, CA (US); Scott J. Limb, Palo Alto, CA (US); Christopher L. Chua, San Jose, CA (US); Sean Garner, Burlingame, CA (US); Sylvia J. Smullin, Menlo Park, CA (US); Qian Wang, Mountain View, CA (US); Rene A. Lujan, Sunnyvale, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 56 days.

(21) Appl. No.: 15/220,164

(22) Filed: Jul. 26, 2016

(65) Prior Publication Data
US 2018/0033577 A1    Feb. 1, 2018

(51) Int. Cl.
*H01H 71/00* (2006.01)
*H01H 61/00* (2006.01)
*H01H 85/00* (2006.01)

(52) U.S. Cl.
CPC .............................. *H01H 85/0052* (2013.01)

(58) Field of Classification Search
None
See application file for complete search history.

(56) References Cited

U.S. PATENT DOCUMENTS

| 3,397,278 A | 8/1968 | Pomerantz |
| 3,666,967 A | 5/1972 | Keister et al. |

(Continued)

FOREIGN PATENT DOCUMENTS

| DE | 102004015546 | 10/2005 |
| WO | WO200143228 | 6/2001 |

OTHER PUBLICATIONS

Oct. 16, 2017, File History for U.S. Appl. No. 14/796,440.
(Continued)

*Primary Examiner* — Calvin Choi
(74) *Attorney, Agent, or Firm* — Hollingsworth Davis, LLC (57) ABSTRACT

A transient electronic device includes electronic elements (e.g., an SOI- or chip-based IC) and a trigger mechanism disposed on a frangible glass substrate. The trigger mechanism includes a switch that initiates a large trigger current through a self-limiting resistive element in response to a received trigger signal. The self-limiting resistive element includes a resistor portion that generates heat in response to the trigger current, thereby rapidly increasing the temperature of a localized (small) region of the frangible glass substrate, and a current limiting portion (e.g., a fuse) that self-limits (terminates) the trigger current after a predetermined amount of time, causing the localized region to rapidly cool down. The frangible glass substrate is engineered such that a stress profile produced by the rapid heating/cooling of the localized region generates an initial fracture force that subsequently propagates throughout the glass substrate, whereby sufficient potential energy is released to powderize the electronic elements.

21 Claims, 5 Drawing Sheets

(56) References Cited

U.S. PATENT DOCUMENTS

| | | | |
|---|---|---|---|
| 3,882,323 A | 5/1975 | Smolker | |
| 4,102,664 A | 7/1978 | Dumbaugh, Jr. | |
| 4,598,274 A | 7/1986 | Holmes | |
| 5,374,564 A | 12/1994 | Bruel | |
| 7,002,517 B2 | 2/2006 | Noujeim | |
| 7,153,758 B2 | 12/2006 | Hata et al. | |
| 7,554,085 B2 | 6/2009 | Lee | |
| 8,130,072 B2 | 3/2012 | De Bruyker et al. | |
| 9,154,138 B2 | 10/2015 | Limb et al. | |
| 9,294,098 B2 | 3/2016 | Shah et al. | |
| 9,356,603 B2 | 5/2016 | Limb et al. | |
| 9,577,047 B2 | 2/2017 | Chua et al. | |
| 9,780,044 B2 | 10/2017 | Limb et al. | |
| 2004/0222500 A1 | 11/2004 | Asper et al. | |
| 2005/0084679 A1 | 4/2005 | Sglavo et al. | |
| 2005/0176573 A1 | 8/2005 | Thoma et al. | |
| 2006/0138798 A1 | 6/2006 | Oehrlein | |
| 2006/0270190 A1 | 11/2006 | Nastasi et al. | |
| 2007/0113886 A1 | 5/2007 | Arao et al. | |
| 2008/0029195 A1 | 2/2008 | Lu | |
| 2008/0311686 A1 | 12/2008 | Morral et al. | |
| 2009/0086170 A1 | 4/2009 | El-Ghoroury et al. | |
| 2010/0035038 A1 | 2/2010 | Barefoot et al. | |
| 2010/0225380 A1 | 9/2010 | Hsu et al. | |
| 2011/0048756 A1 | 3/2011 | Shi et al. | |
| 2011/0183116 A1 | 7/2011 | Hung et al. | |
| 2012/0135177 A1 | 5/2012 | Comejo et al. | |
| 2012/0135195 A1 | 5/2012 | Glaesemann et al. | |
| 2012/0196071 A1 | 8/2012 | Comejo et al. | |
| 2012/0288676 A1 | 11/2012 | Sondergard et al. | |
| 2013/0037308 A1 | 2/2013 | Wang et al. | |
| 2013/0082383 A1 | 4/2013 | Aoya | |
| 2013/0140649 A1 | 6/2013 | Rogers et al. | |
| 2013/0192305 A1 | 8/2013 | Black et al. | |
| 2014/0103957 A1 | 4/2014 | Fritz et al. | |
| 2014/0266946 A1 | 9/2014 | Billy et al. | |
| 2014/0300520 A1 | 10/2014 | Nguyen et al. | |
| 2014/0323968 A1* | 10/2014 | Rogers | H05K 13/0023 604/113 |
| 2015/0001733 A1 | 1/2015 | Karhade | |
| 2015/0044445 A1 | 2/2015 | Garner et al. | |
| 2015/0076677 A1 | 3/2015 | Ebefors | |
| 2015/0089977 A1 | 4/2015 | Li | |
| 2015/0102852 A1* | 4/2015 | Limb | H01L 23/14 327/525 |
| 2015/0229028 A1 | 8/2015 | Billy et al. | |
| 2015/0318618 A1 | 11/2015 | Chen et al. | |
| 2015/0348940 A1 | 12/2015 | Woychik | |
| 2015/0358021 A1 | 12/2015 | Limb et al. | |
| 2015/0372389 A1 | 12/2015 | Chen et al. | |
| 2016/0137548 A1 | 5/2016 | Cabral, Jr. et al. | |
| 2017/0036942 A1 | 2/2017 | Abramov et al. | |
| 2017/0292546 A1 | 10/2017 | Limb et al. | |
| 2018/0033577 A1 | 2/2018 | Whiting et al. | |
| 2018/0033742 A1 | 2/2018 | Chua et al. | |

OTHER PUBLICATIONS

Aug. 8, 2016, File History for U.S. Appl. No. 14/796,440.
U.S. Appl. No. 15/299,385, filed Oct. 20, 2016, Chua et al.
U.S. Appl. No. 15/629,506, filed Jun. 21, 2017, Limb et al.
File History for EP App. No. 17163445.4 as retrieved from the EP Patent Office electronic file system on Feb. 13, 2018, 74 pages.
EP Search Report dated Jan. 4, 2018 for EP App. No. 17182800.7, 14 pages.
Feb. 13, 2018, File History for U.S. Appl. No. 15/092,313.
Feb. 14, 2018, File History for U.S. Appl. No. 15/629,506.
Feb. 13, 2018, File History for U.S. Appl. No. 15/220,221.
Apr. 13, 2018, File History for U.S. Appl. No. 15/220,221.
EP Search Report for EP App. No. 17182802.3 dated Dec. 6, 2017, 9 pages.

* cited by examiner

SELF-LIMITING ELECTRICAL TRIGGERING FOR INITIATING FRACTURE OF FRANGIBLE GLASS

STATEMENT REGARDING FEDERALLY SPONSORED RESEARCH OR DEVELOPMENT

This invention is based upon work supported by DARPA under Contract No. HR0011-14-C-0013. Therefore, the Government has certain rights to this invention.

FIELD OF THE INVENTION

This invention relates to transient electronics, and in particular to trigger devices and triggering methods utilized to initiate the fragmentation of frangible glass substrates in transient electronic assemblies.

BACKGROUND OF THE INVENTION

Large area sensing is critical for a variety of military, ecological and commercial interests and has historically been served through the use of centralized long-range sensors. However, rapid improvements in miniaturization of electronic systems have significantly improved the capabilities of small sensor devices. These micro-sensors have the potential to create "large N" distributed networks with advantages in operational adaptability, non-traditional sensing modalities that are only possible with close proximity, increased sensitivity and knowledge extraction through networked intelligence.

While distributed network systems have remarkable promise, their realistic use is limited by risks associated with their accumulation in the environment, detection and defeat, and exploitation due to inability to maintain positive control (unlike centralized long-range sensors).

The phrase "transient electronics" refers to a relatively new family of electronic devices that disappear (disaggregate and disperse) within a set period of time, making them ideally suited for distributed network systems. Conventional transient electronic systems typically rely on the use of soluble substrates and electronic materials (such as silk). When placed into solvent (typically water), these conventional substrates and electronics slowly dissolve into solution. As such, a distributed network system made up of conventional transient electronic devices can be expected to "disappear" over a relatively short amount of time (e.g., after periodic rainfall).

Although the conventional transient electronic approaches achieve the goal of causing the electronics to "disappear" after use, the long dissolution period required to achieve complete disaggregation and dispersal make the conventional approaches unfit for discrete (e.g., military) applications that require rapid and complete disaggregation upon command. Moreover, early conventional approaches utilize materials that were not compatible with existing integrated circuit fabrication and assembly techniques, requiring the development of new IC fabrication processes at significant cost.

More recently, a new type of transient electronic device was introduced in which functional circuitry fabricated using well-known low-cost fabrication techniques (e.g., CMOS or SOI) and disposed on a frangible glass substrate that, when subjected to a small initial fracture force, underwent complete disaggregation (shattering) in a manner that releases sufficient potential energy to also cause disaggregation of the functional circuitry. The transient event (i.e., disaggregation) was controlled by a trigger mechanism configured to generate the required initial fracture force by way of applying resistive heating, a chemical reaction or a localized mechanical pressure to the frangible glass substrate in response to a suitable trigger signal. An issue with some triggering approaches is that they may require a substantial electronic system to provide a particular current or voltage pulse in order to provide the necessary conditions to initiate fragmentation. For example, resistive heating type trigger mechanisms may require a pulse shaping circuit configured to generate and transmit a shaped current pulse from a power source to the resistive heating element in order to generate initial fracture.

What is needed is a simple and reliable trigger mechanism and triggering method for initiating the powderization of a frangible glass substrate in a transient electronic device that reliably achieves complete, on-command disaggregation of the electronic circuitry formed thereon in response to an electronic trigger signal.

SUMMARY OF THE INVENTION

The present invention is directed to a simple and reliable trigger mechanism and associated triggering method for reliably initiating powderization of functional circuitry (electronic elements) in a transient electronic device by way of generating a localized thermal pulse (i.e., rapid heating followed by rapid cooling) using a self-limiting circuit arrangement that avoids the need for current pulse shaping circuitry and/or complicated connection arrangements, thereby avoiding the problems associated with conventional approaches.

According to an aspect of the invention, the trigger mechanism includes a self-limiting resistive element that is at least partially formed on a frangible glass substrate. The frangible glass substrate is constructed substantially entirely from a glass material having an associated melting point temperature using known techniques such that it undergoes complete disaggregation (shattering) in response to an applied initial fracture force. The electronic elements (e.g., a silicon-on-insulator-based (SOI-based) IC, a chip-based IC, or thin-film electronics patterned directly onto the frangible glass substrate) and the self-limiting resistive element of the trigger mechanism are fixedly attached to one or both surfaces of the frangible glass substrate, with the electronic elements typically dispose over a first region of the frangible glass substrate, and the self-limiting resistive element disposed over a localized (i.e., relatively small) second region of the frangible glass substrate. With this arrangement, the localized thermal pulse generated by the self-limiting resistive element produces a stress profile caused by rapid heating above the glass' melting point temperature and then cooling in the localized region located adjacent (e.g., below) the self-limiting resistive element. By configuring the trigger mechanism in the manner described below, the resulting stress profile generates the desired initial fracture force in the localized region, thereby initiating the complete disaggregation of the frangible glass substrate, along with the electronic elements disposed thereon.

According to another aspect of the present invention, the self-limiting resistive element includes a current-limiting portion (e.g., a fuse, timer-based or thermistor-based circuit) that independently controls (i.e., without requiring an externally-generated control signal) an amount generated heat by way of terminating the flow of a trigger current through the self-limiting resistive element after a predetermined amount of generated heat is transmitted into the localized region of the frangible glass substrate. In an exemplary embodiment, the current-limiting portion is implemented by a fuse structure that is configured to melt/break after a predetermined amount of heat is generated by the self-limiting resistive element, thereby producing an open circuit that terminates further heat generation by way of preventing further trigger current flow through the self-limiting resistive element. Moreover, by configuring the self-limiting resistive element in the manner described below such that heat rapidly dissipates from the localized region of the frangible glass substrate after termination of the trigger current, the self-limiting resistive element provides a simple and reliable mechanism for generating the desired thermal pulse and resulting stress profile that produce the initial fracture force in the localized region of the frangible glass substrate.

According to another aspect of the present invention, the self-limiting resistive element facilitates electronic control of the triggering event using very simple addressing electronics, thereby minimizing system complexity. That is, because the self-limiting resistive element eliminates the need for current shaping electronics, the trigger mechanism is able to achieve complete, on-command disaggregation of the electronic circuitry formed on the frangible glass substrate using a simple switch element that is controllable (i.e., actuated to generate the trigger current) by way of an electronic trigger signal to selectively couple the self-limiting resistive element to a direct-current (DC) power source (e.g., a battery). Using this arrangement, the switch element is turned on at the beginning of a transient event in response to the electronic trigger signal, thereby initiating a large direct current (i.e., the trigger current) to flow from the DC power source through the self-limiting resistive element, whereby the self-limiting resistive element operates as described above to generate the thermal pulse resulting in the initial fracture force causing disaggregation of the frangible glass substrate. As such, in contrast to conventional resistive-heat-type trigger mechanisms that require pulse shaping circuity and complicated addressing arrangements, the triggering mechanism of the present invention is simple and reliable, thereby reducing manufacturing costs and complexity.

As mentioned above, characteristics of the thermal pulse (i.e., the rate and duration of heat generation that produces the rapid temperature increase) are entirely independently controlled by operation of the self-limiting resistive element (i.e., without requiring an externally-generated control signal). Specifically, the self-limiting resistive element is configured to generate resistive heat (i.e., by way of passing the large trigger current through one or more resistor structures) for a predetermined amount of time after actuation of the switch element, whereby a temperature of the localized region of the frangible glass substrate rapidly increases from a relatively low initial temperature (e.g., approximately 140° C.) to a high (first) temperature level temperature (e.g., approximately 220° C.) that is above the melting point temperature of the glass forming the frangible glass substrate. The self-limiting resistive element is further configured to independently control the amount of generated heat by way of terminating the flow of trigger current through the resistor element(s) at the end of the predetermined time period, whereby terminating the heat generating process causes rapid cooling of the localized region (e.g., from the high (first) temperature (e.g., 220° C.) to a lower (second) temperature (e.g., approximately 200° C.), e.g., in approximately one second) by way of heat dissipation from the localized region into surrounding substrate regions. The present inventors determined that a thermal pulse generated in this manner produces a stress profile that reliably generates an initial fracture force in the localized region having sufficient strength to produce subsequent propagating fracture forces that pass throughout the frangible glass substrate, causing "powderization" (i.e., disaggregation or fragmentation) of the frangible glass substrate into micron-sized particulates. When a transient electronic device is constructed in accordance with the present invention, sufficient potential energy is released from the disaggregating/fragmenting glass substrate to cause propagation of cracks from the glass substrate into the electronic elements and other device structures (e.g., the self-limiting resistive element) with sufficient force to entirely powderize these structures as well. Because the trigger mechanism produces the rapid heating/cooling stress profile using only a simple switch and a self-limiting resistive element (i.e., without requiring an external control signal or other circuitry capable of generating a shaped current pulse), the present invention provides a low-cost and reliable triggering mechanism for initiating powderization of electronic elements disposed on a transient electronic device.

According to an embodiment of the present invention, the self-limiting resistive element is entirely formed by a resistive material that is deposited and patterned directly onto a surface of the frangible glass substrate using a standard thin-film fabrication technique (e.g., photolithographic or inkjet printing). In alternative embodiments, the resistive material includes magnesium, copper, tungsten, aluminum, molybdenum or chrome, or a combination of one or more of these metals. Other suitable materials may also be used, provided the material is sufficiently conductive and adheres to the frangible glass substrate surface well enough that heat is transferred efficiently into the localized region during the rapid heating portion of the thermal pulse.

According to an embodiment of the present invention, the self-limiting resistive element includes one or more resistive portion connected in series with the current-limiting portion between two (first and second) terminals, with the first terminal is coupled by way of the switch element to the direct current (DC) power source and the second terminal connected to a suitable ground structure. In one embodiment, the resistive material mentioned above is patterned to form two relatively large resistor structures connected by a narrow fuse element, where the resistor structures are configured to heat up but remain coherent during the thermal pulse, and the fuse element is configured to melt and break at the end of the rapid heating (first) time period. The use of a fuse element to implement the current-control portion of the self-limiting resistive element provides a low-cost, simple and highly reliable structure for independently controlling the amount of heat generated during the rapid heating process, and reliably produces an open circuit condition (i.e., by way of melting/breaking) that terminates flow of the trigger current through the resistor structures at the start of the rapid cooling portion of the thermal pulse.

In a presently preferred embodiment, the resistive material utilized to form the self-limiting resistive element is patterned into a bowtie-type structure in which the two resistor structures including respective downward-tapered sections, and the fuse element is formed by a narrow section of resistive material connected between tapered ends of the downward-tapered sections. In one embodiment, the fuse element includes a straight rectangular structure extending between the tapered end, and in another embodiment the narrow resistive material section forming the fuse element is disposed in a substantially S-shaped pattern. In either case, a width W of the narrow resistive material section is greater than a thickness of the frangible glass substrate determines to induce reliable disaggregation. In a practical embodiment using a 0.25 mm thick frangible glass substrate, the narrow resistive material section forming the fuse element has a width of at least 0.3 mm. In contrast, resistor structures can have almost any size, although while larger resistors ensure reliable fragmentation, they also require more power and energy from the power source. Accordingly, the smallest possible resistor structures are preferred in order to minimize power and energy requirements.

According to an embodiment of the present invention, to facilitate remote (wireless) control over the transient electronic device, the transient electronic device further includes a sensor configured to detect a transmitted wave signal (e.g., a light wave signal, a radio frequency (RF), or an acoustic/sound signal), and configured to then generate the electronic trigger signal used to actuate the switch element. In an exemplary embodiment, a remote optical signal is detected by a photodiode (light wave sensor), whereby current through the photodiode causes a silicon controlled rectifier (switch element) to latch, which in turn couples a battery across the self-limiting resistor element, ultimately causing disaggregation (fragmentation) of the glass substrate and any included electronics. While remote actuation of the transient electronic device is achieved using an optical signal in this example, RF signals and acoustic wave signals may be utilized by replacing the photodiode with a radio-frequency wave sensor or an acoustic wave sensor. Moreover, other physical and chemical stimuli may also be utilized in conjunction with an appropriate sensor to initiate a fragmentation sequence. Similarly, while latching is achieved using a silicon controlled rectifier, other switch elements may also be utilized, such as a single MOSFET transistor or a multiple-element latch circuit.

According to other alternative practical embodiments, one or more of the switch element and sensor utilized to control operation of the triggering mechanism may be formed/mounted directly on the frangible glass substrate, formed on a semiconductor layer/die on which the electronic elements are formed, or disposed on an external printed circuit board to which the transient electronic device is attached. For example, in the practical embodiment described above, one or both of the photodiode/sensor and the silicon controlled rectifier (switch) may be implemented by patterning suitable materials directly onto the frangible glass substrate, or may be implemented using CMOS fabrication techniques on a semiconductor structure (e.g., IC chip or SOI layer) on which the electronic elements are formed and that is fixedly attached to the frangible glass substrate.

In additional alternative embodiments, the frangible glass substrate comprises one of a stressed glass substrate including stress-engineered tensile and compressive layers that are operably attached together, a thermally tempered glass substrate including laminated layers of different glass types having associated different coefficient of thermal expansion (CTE) values, and an ion-exchange treated glass substrate. In each case, the frangible glass substrate contains enough stored energy to generate self-propagating secondary fractures in response to an initial fracture force such that the glass substrate completely disaggregates ("powderizes") into micron-sized particulates by way of a mechanism similar to that captured in a Prince Rupert's Drop. In alternative embodiments, the electronic devices are either fabricated directly onto the frangible glass substrate using standard silicon-on-insulator (SOI) fabrication techniques (i.e., such that the functional circuitry is implemented as an SOI integrated circuit structure), or are separately fabricated on an IC die (chip) that is then attached to the frangible glass substrate using anodic bonding. In either case, the released potential energy during disaggregation of the frangible glass substrate is sufficient to also powderize the electronic devices, along with the trigger mechanism and any other structures that might be disposed on the frangible glass substrate.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in transient electronic devices. The following description is presented to enable one of ordinary skill in the art to make and use the invention as provided in the context of a particular application and its requirements. As used herein, directional terms such as "upper", "upward", "lower", "downward" and "over" are intended to provide relative positions for purposes of description, and are not intended to designate an absolute frame of reference. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
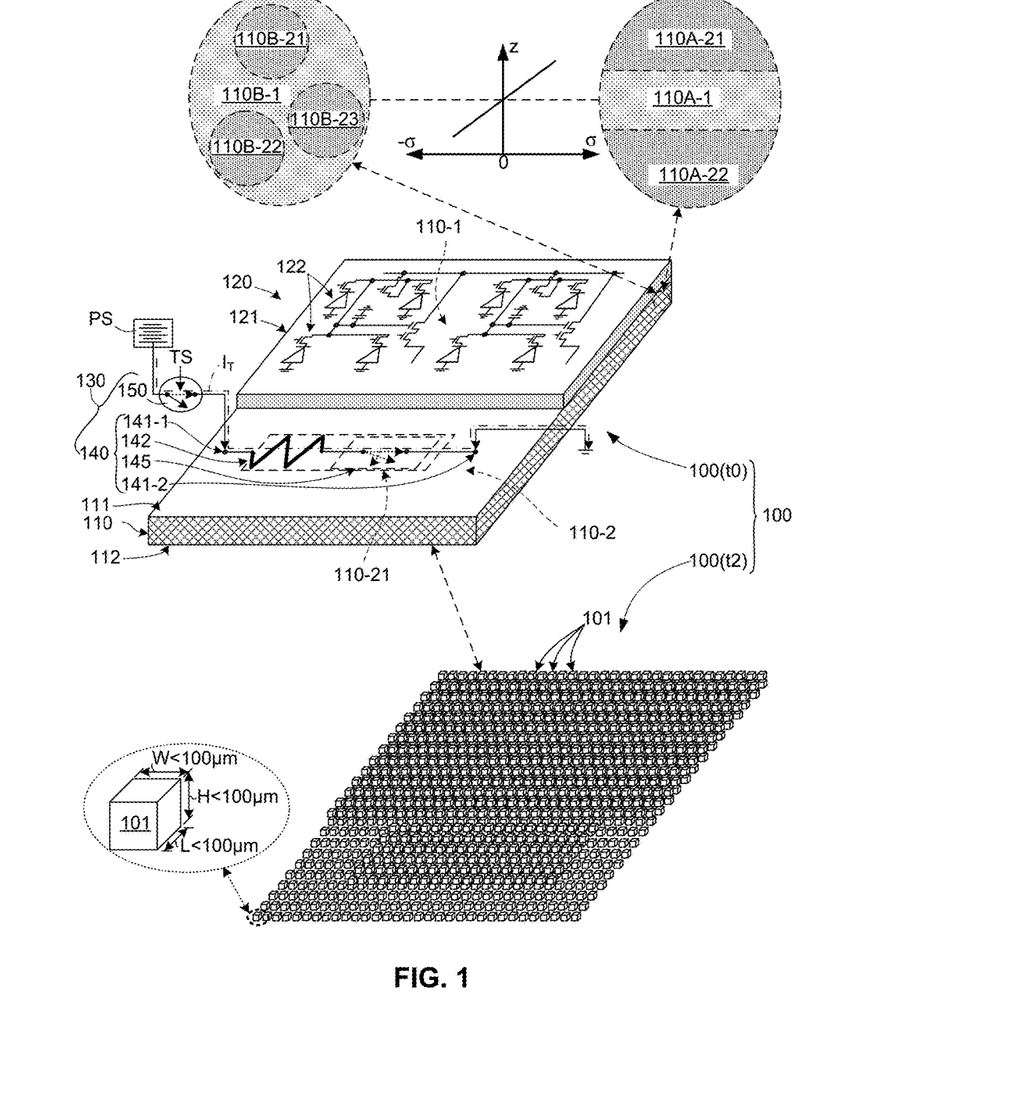
FIG. 1 is a top side perspective view showing a transient electronic device including a trigger mechanism disposed on a frangible glass substrate according to a simplified embodiment of the present invention.

FIG. 1 includes simplified perspective views showing a transient electronic device 100 in a pre-transience "whole" state (i.e., device 100(t0) shown in the middle portion of FIG. 1) and a post-transience "powderized" state (i.e., device 100(t2) shown in the lower portion of FIG. 1). In the pre-transience state (e.g., immediately after production, during normal operation, and during portions of the transient event occurring prior to disaggregation), transient electronic device 100(t0) generally includes functional electronics 120 and a trigger mechanism 130 that are disposed over corresponding regions of frangible glass substrate 110. In the preferred embodiment depicted by device 100(t2) at the bottom of FIG. 1, in the post-transience "powderized" state, the frangible glass substrate and any structures disposed thereon (i.e., functional electronics 120 and any portion of trigger mechanism 130 mounted on frangible glass substrate 110) are completely disaggregated ("powderized") into micron-sized particulates 101 (i.e., have sizes ≤100 µm across).

In order to produce transient electronic device 100 such that it achieves the preferred post-transience "powderized" state depicted in FIG. 1, it is necessary to manufacture or procure frangible glass substrates having the characteristics set forth below. Referring to the middle of FIG. 1, frangible glass substrate 110 is a wafer-like structure having opposing upper and lower surfaces 111 and 112, and is constructed using known techniques such that it undergoes complete disaggregation (shattering) in response to the initial fracture force generated/applied by trigger mechanism 130. In one specific embodiment, frangible glass substrate 110 includes at least one glass structure including a first glass material having a first coefficient of thermal expansion (CTE) value, and multiple second glass structures respectively including one or more different (second) glass materials respectively having a second CTE value, where the second CTE value is different from the first CTE value. For example, as indicated in the upper right bubble in FIG. 1, thermally tempered glass substrate 110A includes a glass structure 110A-1 disposed between two glass structures 110A-21 and 110A-22, where glass structure 110A-1 comprises a different glass material having a different CTE value than the glass material from which glass structures 110A-21 and 110A-22 are formed. Similarly, as indicated in the upper left bubble of FIG. 1, thermally tempered glass substrate 110B includes (second) glass structures 110B-21, 110B-22 and 110B-23 disposed in a (first) glass structure 110B-1, where glass structure 110B-1 comprises a different glass material than that of glass structures 110B-21 to 110B-23. The fabrication of such thermally tempered glass substrates is described in U.S. Pub. App. No. 2015/0358021-A1, which is incorporated herein by reference in its entirety. In another alternative specific embodiment, frangible glass substrate 110 comprises a stressed glass substrate including stress-engineered tensile and compressive layers that are operably attached together in the manner described in U.S. Pat. No. 9,154,138, which is also incorporated herein by reference in its entirety. In yet another alternative specific embodiment, frangible glass substrate 110 an ion-exchange treated glass substrate or interposer fabricated in the manner described in U.S. patent application Ser. No. 14/694,132 filed Apr. 23, 2015 and entitled "Transient Electronic Device With Ion-Exchanged Glass Treated Interposer" which is also incorporated herein by reference in its entirety. When implemented using any of the specific embodiments mentioned above, frangible glass substrate 110 contains enough stored energy to generate self-propagating secondary fractures in response to an initial fracture force such that, as depicted by device 100(t2) at the bottom of FIG. 1), frangible glass substrate 110 completely disaggregates ("powderizes") into micron-sized particulates (i.e., ≤100 µm across) using a mechanism similar to that captured in a Prince Rupert's Drop. In addition, the released potential energy during disaggregation of frangible glass substrate 110 is sufficient to also powderize functional electronics 120 as also illustrated by device 100(t2). In one embodiment, the released potential energy also powderizes portions of trigger mechanism 130 and any other structures that might be disposed on frangible glass substrate 110.

Functional electronics 120 include electronic elements 122 fabricated on a semiconductor base layer 121 (e.g., an SOI layer or an integrated circuit (IC) die/chip) that is fixedly attached to upper surface 111 and dispose over a corresponding region 110-1 of frangible glass substrate 110. As set forth above, the main purpose of transient electronics is to provide a way to essentially entirely eliminate an IC or other electronic elements for purposes of protecting the environment or maintaining confidentiality (i.e., preventing unauthorized reverse engineering of the elements/circuit). A benefit of fabricating transient electronic device 100 on frangible glass substrate 110 is that this approach both facilitates forming functional electronics 120 using low cost manufacturing techniques, and facilitates reliable elimination of functional electronics 120 by way of causing disaggregation of frangible glass substrate 110. In a preferred embodiment, functional electronics 120 are fabricated by way of forming electronic elements 122 on a suitable semiconductor (base) layer 121 using existing IC fabrication techniques (e.g., CMOS), and electronic elements 122 are configured to perform a prescribed useful function (e.g., sensor operations) up until the transient event. In one embodiment, the semiconductor layer 121 is a silicon "chip" (die) upon which electronic elements 122 are fabricated, and then the semiconductor layer 121 is fixedly attached to glass substrate 110 using known die bonding techniques (e.g., anodic bonding or by way of sealing glass) that assure coincident powderization of electronic elements 122 with frangible glass substrate 110. In a presently preferred embodiment, functional electronics 120 includes electronic elements 122 configured to form an IC device using standard silicon-on-insulator (SOI) fabrication techniques (i.e., such that the functional circuitry is implemented as an SOI integrated circuit structure). In another embodiment, functional electronics 120 are fabricated on an IC die that is "thinned" (e.g., subjected to chemical mechanical polishing) before the bonding process.

As set forth above, trigger mechanism 130 is configured to generate an initial fracture force in frangible glass substrate 110 in response to an electronic trigger signal TS. According to the present invention, trigger mechanism 130 achieves this function using a self-limiting resistive element 140 and a switch element 150 that are connected in series between a battery (or other DC power source PS) and ground. As depicted in FIG. 1, at least a portion of trigger mechanism 130 is disposed on upper surface 111 over a second region 110-2 of frangible glass substrate 110 (i.e., away from functional circuitry 120), but may alternatively be formed on lower surface 112. Switch element 150 has a first terminal connected to battery PS, a second terminal connected to a first terminal 141-1 of element 140, and a control terminal operably disposed to receive electronic trigger signal TS, which may be generated by an optional sensor or other control circuitry (not shown). As set forth below, switch element 150 is actuated (switched from an open/non-conducting state to a closed/conducing state) at the start of a transient event by way of asserting trigger signal TS, whereby switch element 150 initiates a DC trigger current $I_T$ that flows from battery PS through self-limiting resistive element 140 to ground. In one embodiment, self-limiting resistive element 140 includes a resistive portion 142 and a current-limiting portion 145 that are connected in series between battery PS and ground by way of a first terminal 141-1 and a second terminal 141-2, respectively, where at least one of resistive portion 142 and a current-limiting portion 145 are disposed on upper surface 111 over a localized (i.e., relatively small) region 111-21 of frangible glass substrate 110. One or both of resistive portion 142 and a current-limiting portion 145 are configured and operably thermally coupled to frangible glass substrate 110 such that self-limiting resistive element 140 generates heat at a rate that rapidly increases a localized temperature of localized region 110-21, and current limiting portion 145 is further configured to independently control (i.e., without requiring an externally-generated control signal) the flow of trigger current $I_T$ by way of terminating the flow of trigger current $I_T$ after localized region 110-21 receives a sufficiently large amount of the heat generated by self-limiting resistive element 140. In a preferred embodiment described below, current-limiting portion 145 is implemented by a fuse element configured to fail (melt and break) after conducting a predetermined amount of trigger current $I_T$ (i.e., after a predetermined amount of heat is generated by self-limiting resistive element 140). In other embodiments, current-limiting portion 145 may be implemented by other elements/circuits configured to implement the described independent control over trigger current $I_T$, such as a thermistor-based circuit configured to terminate the trigger current flow upon detecting a predetermined temperature level, or a timer-based circuit configured to terminate the trigger current flow a preset time after actuation of switch element 150.

Figure 2:
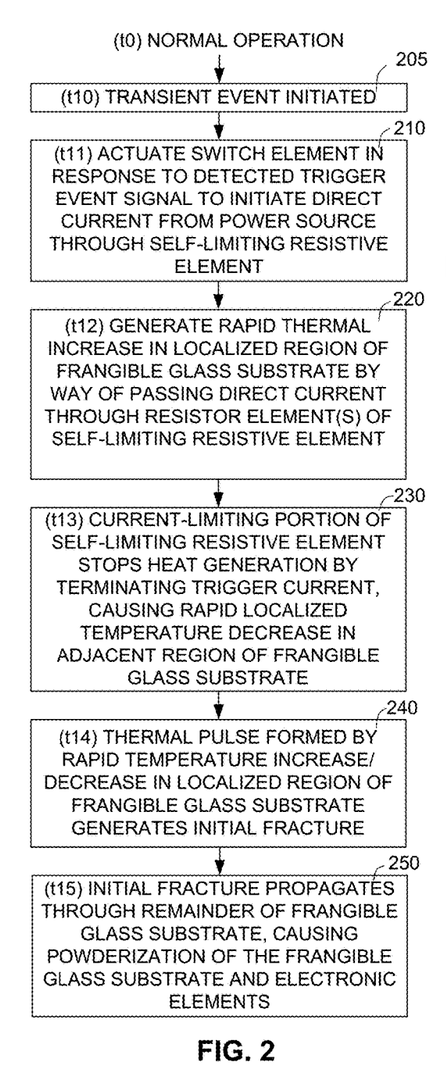
FIG. 2 is a flow diagram showing a generalized method for triggering a disaggregation event on the transient electronic device depicted in FIG. 1.

FIG. 2 is a flow diagram showing a generalized method for triggering a disaggregation event on transient electronic device 100 (shown in FIG. 1), and FIGS. 3(A), 3(B), 3(C), 3(D), 3(E) and 3(F) are partial cross-sectional side views showing a portion of transient electronic device 100 before and during an exemplary disaggregation event.

Figure 3A:
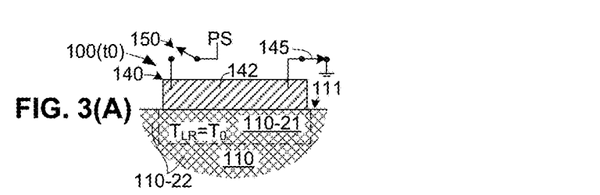
FIGS. 3(A), 3(B), 3(C), 3(D), 3(E) and 3(F) are partial cross-sectional side views showing a portion of the transient electronic device of FIG. 1 at various moments during a disaggregation event.

Referring to the top of FIG. 2, transient electronic device 100(t0) (FIG. 1) is subjected to normal operation (i.e., functional circuitry 120 performs as intended). FIG. 3(A) is a simplified cross-section showing a portion of device 100(t0), where resistive portion 142 of self-limiting resistive element 140 is depicted as a metal structure disposed on upper surface 111 of the frangible glass substrate 110 over localized region 110-21, and current control portion 145 is depicted as a switch in a closed (i.e., conducting) state. At this time t0, switch portion 150 is open (i.e., in a non-conducting state), so no current passes from battery PS through self-limiting resistive element 140, and thus no heat is generated by resistive portion 142. Accordingly, at time t0, a localized temperature $T_{LR}$ in localized region 110-21 assumes the same (relatively low) initial temperature $T_0$ as that of surrounding adjacent regions 100-22 of frangible glass substrate 110.

Referring to block 205 near the top of FIG. 2, the transient event is initiated at a time t10, for example, when a trigger event signal is detected by a sensor (e.g., in response to a wirelessly transmitted light or RF signal), or unauthorized tampering is detected.

Figure 3B:
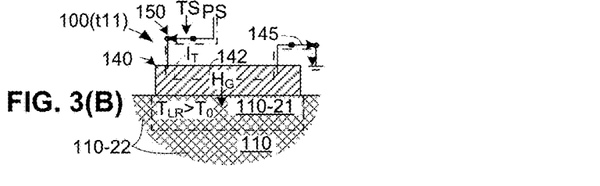

As indicated in block 210 (FIG. 2) and FIG. 3(B), at a time t11 (i.e., a moment after time t10), trigger signal TS (FIG. 1) is asserted and applied to the control terminal of switch element 150, whereby switch 150 is actuated to initiate the flow of trigger current $I_T$ through resistive portion 142 and current control portion 145 to ground, whereby resistive portion 142 begins to generate heat $H_G$ that is transmitted through upper surface 111 of frangible glass substrate 110 into localized region 110-21, thereby causing localized temperature $T_{LR}$ to increase above initial temperature $T_0$.

Figure 3C:
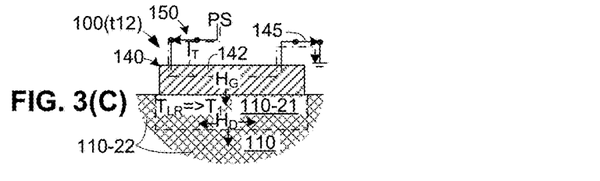

As indicated in block 220 (FIG. 2) and FIG. 3(C), at a subsequent time t12, the continued flow of trigger current $I_T$ causes resistive portion 142 to generate heat $H_G$ at a rate that rapidly increases localized temperature $T_{LR}$ toward a predetermined target temperature $T_1$. According to an aspect of the invention, this rapid temperature increase occurs at a rate that causes localized temperature $T_{LR}$ to increase at a rate faster than the temperature in surrounding regions 110-22. That is, as indicated in FIG. 3(C), generated heat $H_G$ from self-limiting resistive element 140 enters localized region 110-21 at a faster rate than dissipating heat $H_G$ leaves localized region 110-21 into surrounding regions 110-22, thereby causing localized temperature $T_{LR}$ of localized region 110-21 to rapidly increase from the initial temperature $T_0$ toward the higher target (first) temperature level $T_1$ while surrounding regions 110-22 remain at a substantially lower temperature.

Figure 3D:
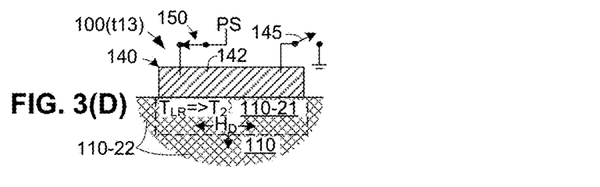

As indicated in block 230 (FIG. 2) and FIG. 3(D), at time t13, current limiting portion 145 actuates to terminate the generation of heat $H_G$ by way of generating an open circuit condition that terminates the flow of trigger current through resistive portion 142. According to another aspect of the invention, self-limiting resistive element is configured such that the termination of generated heat causes a rapid decrease of localized temperature TLR toward a lower (second) temperature $T_2$ by way of heat $H_D$ dissipating out of localized region 110-21 into cooler surrounding regions 110-22.

Figure 3E:
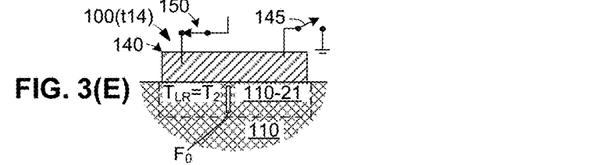

As indicated in block 240 (FIG. 2) and FIG. 3(E), at time t14, the thermal pulse generated by the rapid temperature increase and rapid temperature decrease described above with reference to FIGS. 3(C) and 3(D) produces a stress profile in localized region 110-21 of frangible glass substrate 110 that is sufficient to produce an initial fracture force $F_0$ in localized region 110-21.

As indicated in block 240 (FIG. 2) and FIG. 3(E), at time t14, the thermal pulse generated by the rapid temperature increase and rapid temperature decrease described above with reference to FIGS. 3(C) and 3(D) produces a stress profile in localized region 110-21 of frangible glass substrate 110 that has sufficient force to produce an initial fracture force $F_0$ in localized region 110-21. Subsequently, as indicated in block 250 (FIG. 2) and FIG. 3(F), at time t15, the initial fracture force $F_0$ produces propagating fracture forces $F_P$ that radiate from localized region 110-21 throughout frangible glass substrate 110 and electronic elements 122, thereby causing the complete disaggregation depicted by device 100(t2) at the bottom of FIG. 1. Accordingly, by configuring trigger mechanism 130 such that it generate the thermal pulse in frangible glass substrate 110 as described above, and by configuring frangible glass substrate 110 such that it generates initial fracture force $F_O$ in localized region 110-21 in response to the applied thermal pulse, and such that initial fracture force $F_O$ causes propagating fracture forces $F_P$ that result in complete disaggregation of frangible glass substrate 110 and electronic elements 122 in the manner described above, the present invention facilitates the construction of low-cost, highly reliable transient electronic devices 100 without the need for pulse shaping circuity and complicated addressing arrangements.

Figure 3F:
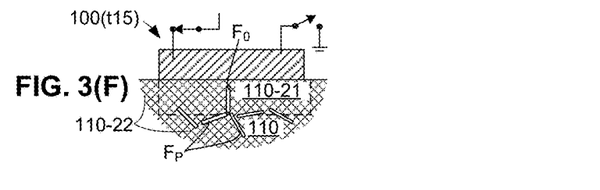
Figure 4:
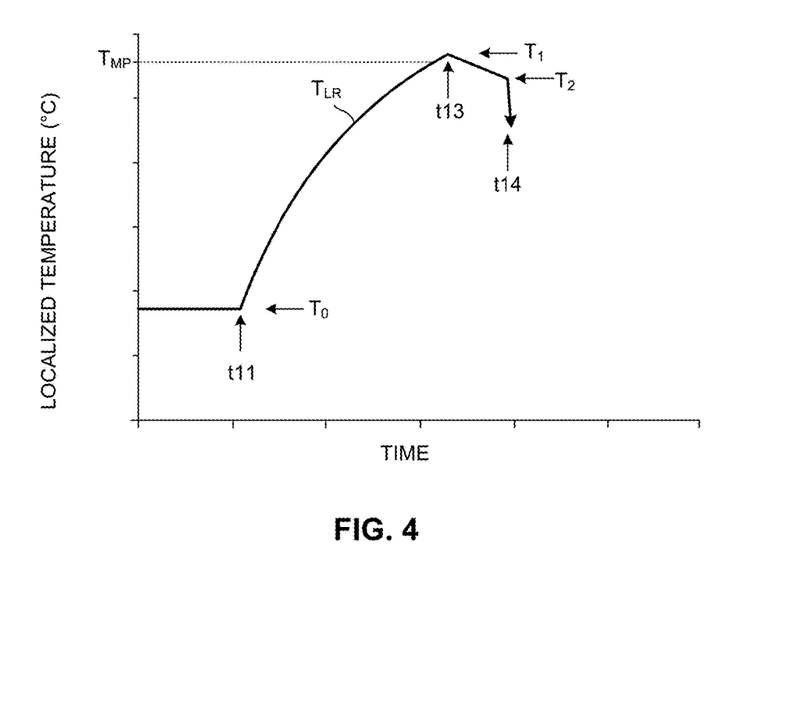
FIG. 4 is a time-temperature graph illustrating an exemplary thermal pulse generated during the disaggregation event described with reference to FIGS. 3(A) to 3(F)
Figure 5:
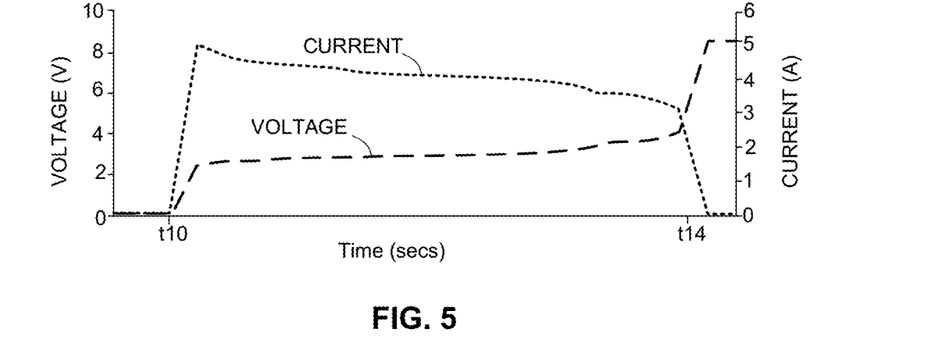
FIG. 5 is a time-voltage/current graph illustrating exemplary operating characteristics of a trigger mechanism utilized during the disaggregation event described with reference to FIGS. 3(A) to 3(F)

FIG. 4 is a time-temperature graph depicting changes to localized temperature $T_{LR}$ that illustrate an exemplary thermal pulse generated by self-limiting resistive element 140 during the exemplary disaggregation event described above with reference to FIGS. 3(A) to 3(F), and FIG. 5 is a time-voltage/current graph illustrating exemplary operating characteristics of self-limiting resistive element 140 during the exemplary disaggregation event. As indicated in FIG. 4, localized temperature $T_{LR}$ remains at initial temperature $T_O$ until time t11 (i.e., when the flow of trigger current is initiated as described above with reference to FIG. 3(B)). The subsequent rapid increase during the period from time t11 to time t13 is caused by generated heat $H_G$ entering localized region 110-21 in the manner described above with reference to FIGS. 3(B) and 3(C). Self-limiting resistive element 140 is configured such that the peak (highest) value of localized temperature $T_{LR}$ (i.e., high/first temperature $T_1$, which occurs at time t13, and is above the melting point temperature TMP of the glass forming frangible glass substrate 110. After self-limiting resistive element 140 actuates, heat begins dissipating from localized region 110-21 into surrounding regions 110-22 of frangible glass substrate 110, as depicted in FIG. 3(D), causing the subsequent rapid temperature decrease during the period from time t13 to time t14. At time t14, the stress profile caused by the rapid increase to temperature $T_1$ followed by the period of rapid cooling produces initial fracture force $F_O$ in localized region 110-21, as depicted in FIG. 3(E). Almost immediately after time t14, initial fracture force $F_O$ cause propagating fracture forces $F_P$ that completely disaggregate device 100 in a very short amount of time, as depicted in FIG. 3(F), resulting is rapid cooling. As indicated in FIG. 5, the current through self-limiting resistive element 140 jumps to a maximum value (e.g., approximately 5 Amps) at time t10, when switch 150 actuates, slowly decreases as resistive portion 142 gradually heats up, and then drops to zero at time t14 when current control element 145 actuates. In contrast, the voltage across self-limiting resistive element 140 gradually increases from 0V at time t10 to an intermediate value (e.g., approximately 4 Volts) as resistive portion 142 gradually heats up, and then jumps to a maximum value (e.g., approximately 9 Volts) at time t14 when current control element 145 actuates.

Figure 6:
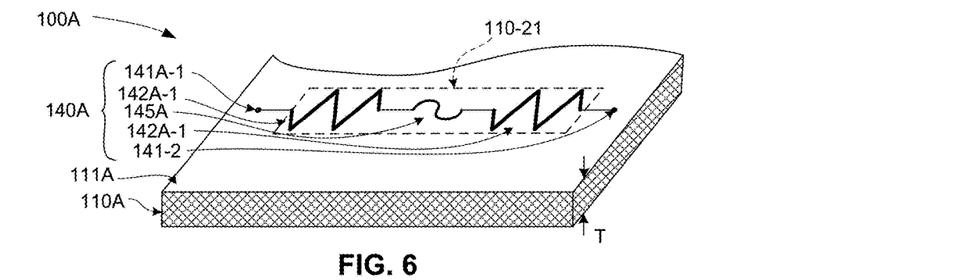
FIG. 6 is a partial perspective view showing the self-limiting resistive element of a triggering mechanism according to an exemplary practical embodiment of the present invention.

FIG. 6 is a perspective view showing a portion of a transient electronic device 100A having a self-limiting resistive element 140A comprising a fuse-type current-limiting portion 145A connected in series between two (first and second) resistor structures (resistive portions) 142A-1 and 142A-2, which are respectively connected to opposing (first and second) terminals 142A-1/2 and disposed over localized region 110-21 in the manner described above. As in the embodiment shown in FIG. 1, when operably connected together, terminal 141A-1 is coupled by way of a switch element (not shown) to the direct current (DC) power source and terminal 141A-2 is connected to a suitable ground structure. In a preferred embodiment, resistor structures 142A-1 and 142A-2 and fuse-type current-limiting portion 145A are produced by depositing a single (common) resistive material (e.g., one or more of magnesium, copper, tungsten, aluminum, molybdenum and chrome) directly onto upper surface 111A of frangible glass substrate 110A. The critical issue associated with the selection of the resistive material is that it is sufficiently conductive and adheres to upper surface 111A of frangible glass substrate 110A well enough that heat generated by resistive portions 142A-1 and 142A-2 and current-limiting portion 145A is transferred efficiently into localized region 110-21 during the rapid heating process of a thermal pulse. The resistive material is printed, etched or otherwise patterned such that resistor structures 142A-1 and 142A-2 respectively comprise relatively large structures 142A-1/2, and fuse-type current-limiting portion 145A comprises a relatively narrow thin structure configured to function as a fuse element. That is, when a sufficiently large current passes between terminals 141A-1 and 141A-2, resistor structures 142A-1 and 142A-2 and current-limiting portion 145A undergo resistive heating, but its relatively narrow cross-section causes current-limiting portion 145A to produce a higher temperature, which in the preferred embodiment is sufficient to cause melting and breakage when subjected to a suitable trigger current. Implementing current-limiting portion 145A using a fuse-type current-limiting portion (fuse element) provides a low-cost, simple and highly reliable structure for independently controlling the amount of heat generated by self-limiting resistive element 140A during the rapid heating process of a thermal pulse, and reliably produces an open circuit condition (i.e., by way of melting/breaking) that terminates flow of trigger current through resistor structures 142A-1 and 142A-2 at the start of the rapid cooling portion of the thermal pulse.

Figure 7A:
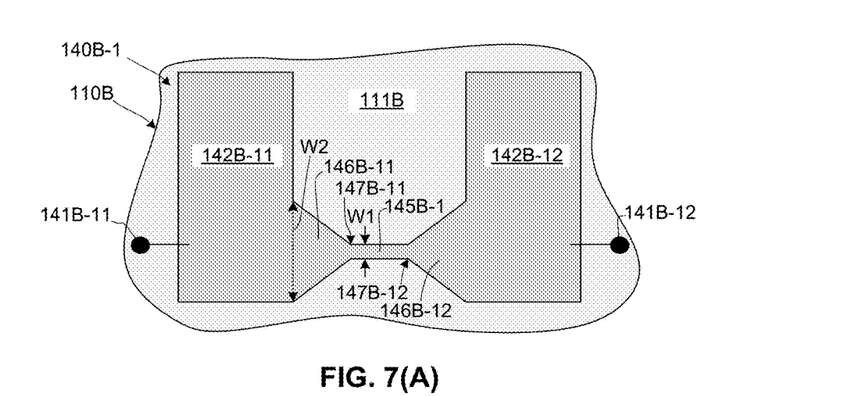
FIGS. 7(A) and 7(B) are top plan views showing self-limiting resistive elements having bowtie-type patterns according to alternative exemplary specific embodiments of the present invention.
Figure 7B:
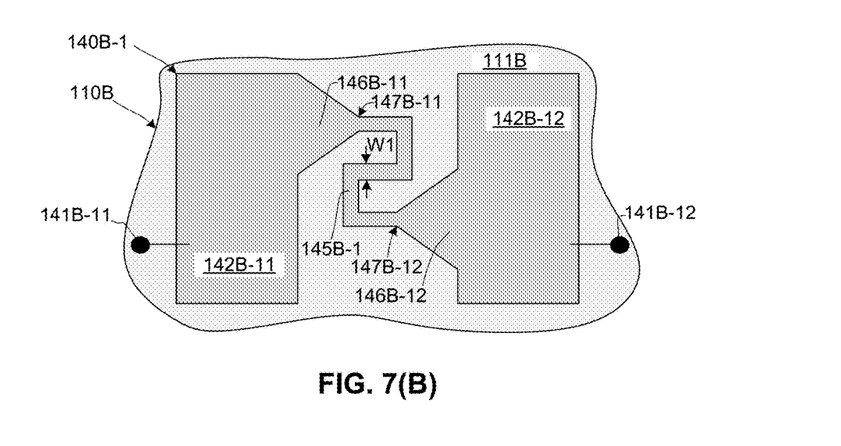

FIGS. 7(A) and 7(B) are top plan views showing self-limiting resistive elements 140B-1 and 140B-2 including bowtie-type patterned metal layer structure disposed directly on upper surface 111B of frangible glass substrate 110B, with each resistive element including a fuse element connected between downward-tapered sections of two resistor structures. For example, self-limiting resistive element 140B-1 includes a first resistor structure 142B-11 including a downward-tapered section 146B-11, a second resistor structure 142B-12 including a downward-tapered section 146B-12, and a fuse element 145B-1 connected between tapered ends 147B-11 and 147B-12 of downward-tapered sections 146B-11 and 146B-12, respectively. Similarly, self-limiting resistive element 140B-2 includes a first resistor structure 142B-21 including a downward-tapered section 146B-21, a second resistor structure 142B-22 including a downward-tapered section 146B-22, and a fuse element 145B-2 connected between tapered ends 147B-21 and 147B-22. In each case, fuse elements 145B-1 and 145B-2 comprise narrow neck structures having widths W1 that are configured to melt and break when subjected to a trigger current. In a preferred embodiment, width W1 is greater than a thickness frangible glass substrate 110B (e.g., thickness T shown in FIG. 6). For example, in a practical embodiment using a 0.25 mm thick frangible glass substrate, fuse elements 145B-1 and 145B-2 have widths W1 of at least 0.3 mm. In contrast, the resistor structures of both self-limiting resistive elements (e.g., resistor structure 146B-11) can have almost any width (size) W2, although larger resistors require more power and energy from the power source.

As depicted by the alternative embodiments shown in FIGS. 7(A) and 7(B), different fuse configurations may be utilized to generate desired thermal pulse characteristics. Specifically, self-limiting resistive elements 140B-1 and 140B-2 differ in that fuse element 145B-1 comprises a straight rectangular structure extending between tapered ends 147B-11 and 147B-12, and fuse element 145B-2 comprises an S-shaped structure extending between tapered ends 147B-21 and 147B-22. These different fuse arrangements provide different benefits, by allowing control over the applied energy and power by tuning the resistance of the trigger as well as tuning the area over which the heat is applied which can impact the time to fragment.

Figure 8:
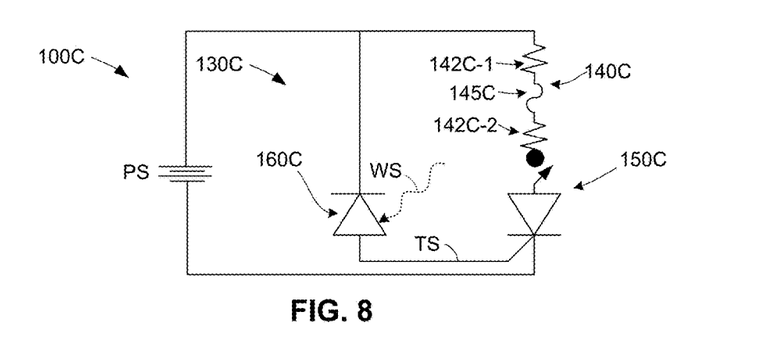
FIG. 8 is a circuit diagram showing an exemplary trigger mechanism configured for remote actuation according to another embodiment of the present invention.

FIG. 8 is a circuit diagram showing a partial transient electronic device 100C including a remotely (wirelessly) controllable trigger mechanism 130C including a sensor 160C configured to detect a transmitted wave signal WS (e.g., a light wave signal, a radio frequency (RF), or an acoustic/sound signal), and configured to then generate the electronic trigger signal TS used to actuate the switch element. As in the previous embodiment, trigger mechanism 130C includes a self-limiting resistive element 140C and a switch element 150C, where self-limiting resistive element 140C includes a fuse element 145C connected between a first resistor structure 142C-1 and a second resistor structure 142C-2. In an exemplary embodiment, switch element 150C is implemented using a silicon controlled rectifier, wave signal WS is an optical signal, and sensor 160C is a photodiode (or other light wave sensor) operably coupled to switch element 150C and configured to activate in response to optical signal WS such that current through photodiode 160C actuates switch element 150C by way of utilizing the current to cause the silicon controlled rectifier to latch, which in turn couples battery PS across self-limiting resistor element 140C, ultimately causing disaggregation (fragmentation) of the glass substrate and any included electronics in the manner described above. While remote actuation of the transient electronic device is achieved using an optical signal in this example, RF signals and acoustic wave signals may be utilized by replacing photodiode 160C with a radio-frequency wave sensor or an acoustic wave sensor. Moreover, other physical and chemical stimuli may also be utilized in conjunction with an appropriate sensor to initiate a fragmentation sequence. Similarly, while latching is achieved using silicon controlled rectifier 150C in the practical embodiment, other switch elements may also be utilized, such as a latch circuit comprising a single MOSFET transistor or a MOSFET-based multiple-element circuit.

Figure 9A:
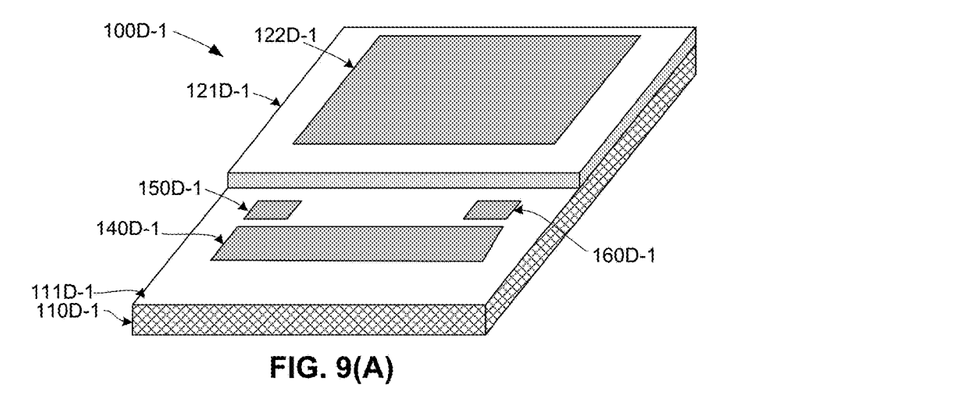
FIGS. 9(A) and 9(B) are simplified perspective views showing transient electronic devices including remote actuation according to alternative specific embodiments.
Figure 9B:
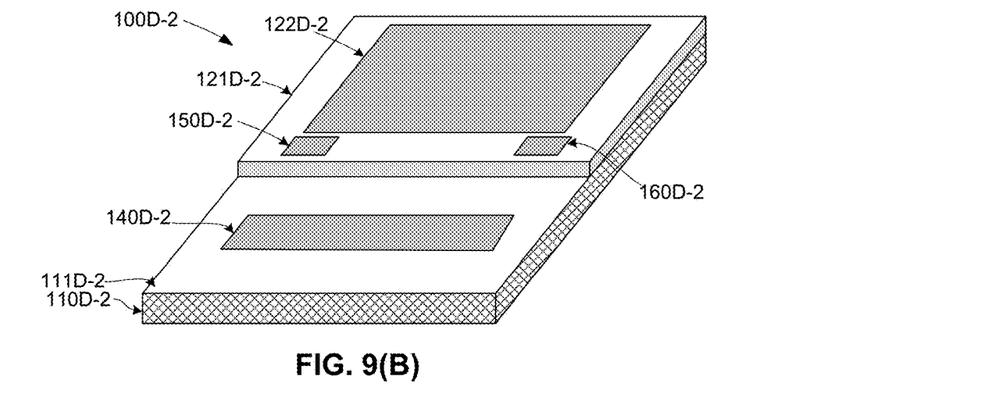

FIGS. 9(A) and 9(B) show simplified transient electronic devices 100D-1 and 100D-2 according to alternative practical embodiments in which sensor and/or switch elements are either fabricated or mounted directly on the "host" frangible glass substrate, or fabricated concurrently with the electronic elements on a semiconductor layer. For example, FIG. 9(A) shows a device 110D-1 in which a sensor 160D-1 (e.g., a photodiode) and a switch element 150D-1 (e.g., a silicon controlled rectifier) are implemented by suitable materials printed or patterned directly onto surface 111D of frangible glass substrate 110D. Alternatively, as shown in FIG. 9(B), device 110D-2 includes a sensor 160D-2 and a switch element 150D-2 fabricated using CMOS fabrication techniques on a semiconductor structure 121D-2 (e.g., IC chip or SOI layer) on which the electronic elements 122D are formed. In both embodiments, self-limiting resistive elements 140D-1 and 140D-2 are formed directly on substrates 1 In another embodiment (not shown), one or both of the sensor and switch element may be disposed on a host PC board and connected by way of suitable conductive connection to the Although the present invention has been described with respect to certain specific embodiments, it will be clear to those skilled in the art that the inventive features of the present invention are applicable to other embodiments as well, all of which are intended to fall within the scope of the present invention. For example, although self-limiting resistive elements having bowtie-type arrangements are described above, other arrangements may be used.

The invention claimed is:

1. A transient electronic device including:
a frangible glass substrate;
one or more electronic elements disposed on the frangible glass substrate such that fracturing of the frangible glass substrate causes fracturing of the electronic elements; and
a trigger mechanism comprising:
a self-limiting resistive element comprising a resistive material disposed over a localized region of said frangible glass substrate, the self-limiting resistive element comprising first and second resistor structures; and
a switch element coupled to the self-limiting resistive element, wherein said self-limiting resistive element is configured such that:
during a first time period after said switch element is actuated to initiate a trigger current from a power source through said self-limiting resistive element, heat generated by said self-limiting resistive element increases a localized temperature of said localized region from an initial temperature toward a first temperature level, and
a current limiting portion of said self-limiting resistive element, comprising a fuse element connected between the first and second resistor structures, independently controls the flow of said trigger current such that said trigger current flow is terminated when said localized temperature of said localized region reaches said first temperature level, thereby causing said localized temperature to decrease from said first temperature level to a second temperature level,
wherein said frangible glass substrate is configured such that a stress profile generated in said localized region by a thermal pulse comprising said thermal increase and said thermal decrease is sufficient to produce an initial fracture force in said localized region.

2. The transient electronic device according to claim 1, wherein said resistive material of said self-limiting resistive element comprises one or more of magnesium, copper, tungsten, aluminum, molybdenum and chrome that is disposed directly onto a surface of said frangible glass substrate.

3. The transient electronic device according to claim 1, wherein said self-limiting resistive element is connected in series with said current-limiting portion between first and second terminals,
wherein said first terminal is coupled by way of said switch element to a direct current (DC) power source, and
wherein said second terminal is connected to ground.

4. The transient electronic device according to claim 3, wherein said fuse element is configured to break after said first time period, thereby terminating flow of said trigger current through said first and second resistor structures.

5. The transient electronic device according to claim 4, wherein said self-limiting resistive element comprises a patterned metal layer structure disposed directly on a surface of said frangible glass substrate with said first and second resistor structures respectively including first and second downward-tapered sections, and said fuse element comprising a narrow structure connected between the first and second downward-tapered sections.

6. The transient electronic device according to claim 5, wherein said narrow portion comprises a straight rectangular structure extending between tapered ends of said first and second downward-tapered sections and having a width that is greater than a thickness of said frangible glass substrate.

7. The transient electronic device according to claim 6, wherein said thickness of said frangible glass substrate is approximately 0.25 mm, and said width of said narrow portion is approximately 0.3 mm or greater.

8. The transient electronic device according to claim 1, wherein said trigger mechanism further comprises a sensor configured to detect a predetermined transmitted wave signal, and configured to generate said trigger signal upon detection of said predetermined transmitted wave signal.

9. The transient electronic device according to claim 8, wherein said sensor comprises one of a light wave sensor, a radio-frequency wave sensor, and an acoustic wave sensor.

10. The transient electronic device according to claim 8, wherein said switch element comprises one of a silicon controlled rectifier, a single transistor and a multiple-element circuit.

11. The transient electronic device according to claim 8, wherein at least one of said switch element and said sensor is disposed directly on said frangible glass substrate.

12. The transient electronic device according to claim 8, wherein said one or more electronic elements are disposed on a semiconductor structure that is fixedly attached to said frangible glass substrate, and wherein at least one of said switch element and said sensor is disposed on said semiconductor structure.

13. The transient electronic device according to claim 1, wherein said frangible glass substrate comprises one of a stressed glass substrate, a thermally tempered glass substrate, and an ion-exchange treated glass substrate.

14. The transient electronic device according to claim 9, wherein said one or more electronic elements comprise an integrated circuit fabricated on one of a silicon-on-insulator layer and a silicon die integrated circuit chip fixedly disposed on said frangible glass substrate.

15. A triggering method for initiating fracturing of electronic elements disposed on a frangible glass substrate comprising glass having a melting point temperature, said method comprising:
generating a thermal increase in a localized region of said frangible glass substrate by actuating a switch element coupled between a power source and a self-limiting resistive element comprising a fuse element connected between first and second resistor structures, such that a direct current flows from the power source through the switch element and the self-limiting resistive element, thereby causing the self-limiting resistive element to generate and transmit heat into said localized region at a sufficiently high rate to cause a localized temperature of said localized region to increase from an initial temperature to a first temperature, said first temperature being higher than said melting point temperature; and generating a thermal decrease such that said localized temperature in said localized region decreases from said first temperature to a second temperature, said second temperature being lower than said first temperature, wherein a thermal pulse generated by said thermal increase and said thermal decrease generates an initial fracture force in the localized region,
wherein a duration of said thermal increase is independently controlled by said self-limiting resistive element.

16. The method of claim 15, further comprising detecting a wave signal, and wherein generating said thermal increase comprises controlling said switch element in response to said detected wave signal.

17. The method of claim 16, wherein detecting said wave signal comprises detecting one of a light wave signal, a radio-frequency wave signal, and an acoustic wave signal.

18. The method of claim 16, wherein detecting said wave signal comprises utilizing a photodiode to detect a light signal, and wherein controlling said switch element comprises controlling a silicon controlled rectifier using a current passing through said photodiode.

19. A transient electronic device including:
a frangible glass substrate;
one or more electronic elements disposed on the frangible glass substrate; and a trigger mechanism comprising:
a self-limiting resistive element including a fuse element disposed between a first resistor structure and a second resistor structure disposed on said frangible glass substrate; and
a switch element coupled between the self-limiting resistive element and a power source such that actuation of said switch element initiates a trigger current from said power source through said self-limiting resistive element,
wherein said self-limiting resistive element is configured such that passing said trigger current from said power source through said self-limiting resistive element produces a thermal pulse in said frangible glass substrate, and
wherein said frangible glass substrate is configured such that a stress profile generated by said thermal pulse causes an initial fracture force in said localized region, and said frangible glass substrate is further configured such that said initial fracture force causes propagating fracture forces that result in fracture of said frangible glass substrate and said one or more electronic elements.

20. The transient electronic device according to claim 19, wherein said switch element comprises one of a silicon controlled rectifier, a single transistor and a multiple-element circuit.

21. The transient electronic device according to claim 19, wherein said trigger mechanism further comprises a sensor configured to detect a predetermined transmitted wave signal, and configured to actuate said switch element by generating a trigger signal upon detection of said predetermined transmitted wave signal.

* * * * *